US006755933B2

United States Patent
Wang et al.

(12) United States Patent
(10) Patent No.: US 6,755,933 B2
(45) Date of Patent: Jun. 29, 2004

(54) SEMICONDUCTOR PROCESS RECORDING APPARATUS

(75) Inventors: Hung-hsiang Wang, Hsinchu (TW);
Wei-chen Chen, Hsinchu (TW);
Shuenn-chuan Yu, Hsinchu (TW);
Pan-kai Liu, Hsinchu (TW); Andy Lin, Hsinchu (TW); Hsin-chen Liu, Hsinchu (TW)

(73) Assignee: Macronix International Co., Ltd. (TW)

( * ) Notice: Subject to any disclaimer, the term of this patent is extended or adjusted under 35 U.S.C. 154(b) by 120 days.

(21) Appl. No.: 10/126,192

(22) Filed: Apr. 19, 2002

(65) Prior Publication Data

US 2003/0196758 A1 Oct. 23, 2003

(51) Int. Cl.[7] .................... H05H 1/00; C23C 16/00
(52) U.S. Cl. ................ 156/345.25; 156/345.24; 156/345.28; 118/712
(58) Field of Search .................. 156/345.25, 345.24, 156/345.28; 118/715, 712

(56) References Cited

U.S. PATENT DOCUMENTS 5,322,590 A * 6/1994 Koshimizu .................... 438/9
5,354,381 A * 10/1994 Sheng ...................... 118/723 E
5,958,258 A * 9/1999 Ishihara et al. ............... 216/60

* cited by examiner

Primary Examiner—Parviz Hassanzadeh
(74) Attorney, Agent, or Firm—Martine & Penilla, LLP

(57) ABSTRACT

A semiconductor process recording apparatus comprises a buffer circuit and a endpoint recording device. The input terminal of the buffer circuit is connected to an external endpoint apparatus for receiving a first signal output from the endpoint apparatus. The output terminal of the buffer circuit is connected to the endpoint recording device for outputting a second signal representative of the first signal in response to the first signal. When receiving the second signal, the endpoint recording device outputs a feedback signal to the buffer circuit on the basis of the second signal. Because the feedback signal is blocked by the buffer circuit, the external endpoint apparatus is protected from the damage caused by the feedback signal, thereby greatly reducing the production cost and rate of semiconductor manufacturing.

7 Claims, 3 Drawing Sheets

SEMICONDUCTOR PROCESS RECORDING APPARATUS

BACKGROUND OF THE INVENTION

A. Field of the Invention

The present invention relates to a semiconductor process recording apparatus and, more particularly, to a semiconductor process recording apparatus capable of preventing endpoint apparatus connected thereto from being burned out.

B. Description of the Related Art

In a conventional semiconductor process, when the circuit system in a endpoint apparatus inputs a signal to a conventional semiconductor process apparatus, the conventional semiconductor process apparatus generates and outputs a feedback signal with a high voltage level pulse to the circuit system of the endpoint apparatus. The feedback signal usually causes components, such as an emission board, of the circuit system of the endpoint apparatus burned out, resulting in the increase of the production cost for semiconductor manufacturing. Such a problem caused by the conventional semiconductor recording apparatus is described in detail as follows with reference to FIG. 1.

As shown in FIG. 1, in the conventional semiconductor process, such as a semiconductor process applied with decoupled plasma source (DPS) technology, an endpoint apparatus 10 outputs an endpoint signal SE to a conventional semiconductor process recording apparatus 11 connected thereto in order to appropriately record the working state of the endpoint apparatus 10 in current operation. In addition, the conventional semiconductor process recording apparatus 11 generates and outputs a feedback signal SF to the endpoint apparatus 10 in response to the received endpoint signal SE. Because the feedback signal SF thus generated typically has a high voltage level pulse, the feedback signal SF generally causes components of the endpoint apparatus 10 damaged. For example, an emission board of the endpoint apparatus 10 is burned out due to the feedback signal, resulting in that the whole endpoint apparatus 10 can not operate any more. Particularly to the process applied with decoupled plasma source technology, since it is necessary for the endpoint apparatus 10 to keep outputting power for a long time, that is, an RF module (not shown) must continuously operate, electronic devices in the emission board (not shown) keep serving as loading. As a result, the emission board of the endpoint apparatus 10 is more easily burned out by overheating due to the feedback signal SF generated from the conventional semiconductor process recording apparatus 11.

Therefore, in the semiconductor process using the conventional semiconductor process recording apparatus 11, it is inevitable to replace with a number of new endpoint apparatus in order to restore the proceeding of the semiconductor process, resulting in the increase of the production cost. Moreover, the period of time spent for usually replacing the endpoint apparatus 10 greatly reduces the production rate of semiconductor manufacturing.

SUMMARY OF THE INVENTION

In view of the above-mentioned problems of the conventional semiconductor process recording apparatus, it is an object of the present invention to provide a semiconductor process recording apparatus for blocking the feedback signal having a high voltage level pulse, thereby preventing the endpoint apparatus connected to the semiconductor process recording apparatus according to the present invention from being damaged.

In order to achieve the above-mentioned object, a semiconductor process recording apparatus according to the present invention includes a buffer circuit and a endpoint recording device. In the present invention, the input terminal of the buffer circuit is connected to an external endpoint apparatus, for receiving a first signal output from the endpoint apparatus. The output terminal of the buffer circuit is connected to the endpoint recording device, for outputting a second signal representative of the first signal, in response to the first signal. For example, the buffer circuit may include a voltage follower and a resistor. When receiving the second signal, the endpoint recording device outputs a feedback signal to the buffer circuit on the basis of the second signal. Because the feedback signal is blocked by the buffer circuit, it is impossible for the feedback signal to be output to the external endpoint apparatus, thereby protecting the external endpoint apparatus from damage caused by the feedback signal.

The semiconductor process recording apparatus according to the present invention further includes an analog/digital converter connected between the buffer circuit and the endpoint recording device, for converting an analog signal from the buffer circuit into a digital signal to be output to the endpoint recording device.

As described above, the semiconductor process recording apparatus according to the present invention successfully protects the external endpoint apparatus from being damaged by the feedback signal having a high voltage level pulse, so it is not necessary for the process to be stopped for replacing new apparatus, thereby greatly reduce the production cost and rate of semiconductor manufacturing.

BRIEF DESCRIPTION OF THE DRAWINGS

Above-mentioned and other objects, features, and advantages of the present invention will become apparent with reference to the following detailed descriptions and accompanying drawings, wherein.

DETAILED DESCRIPTION OF THE PREFERRED EMBODIMENTS

The preferred embodiments according to the present invention will be described in detail with reference to the drawings.

Figure 1:
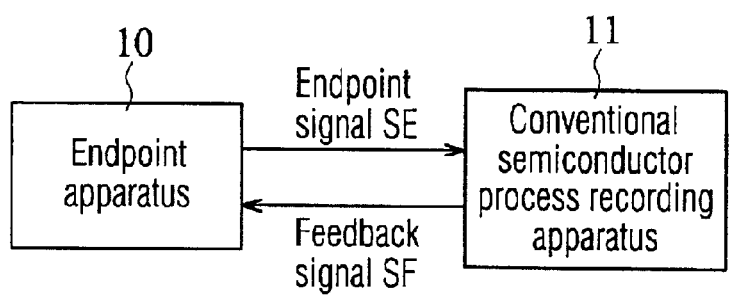
FIG. 1 is a circuit block diagram showing a conventional endpoint apparatus and semiconductor process recording device.
Figure 2A:
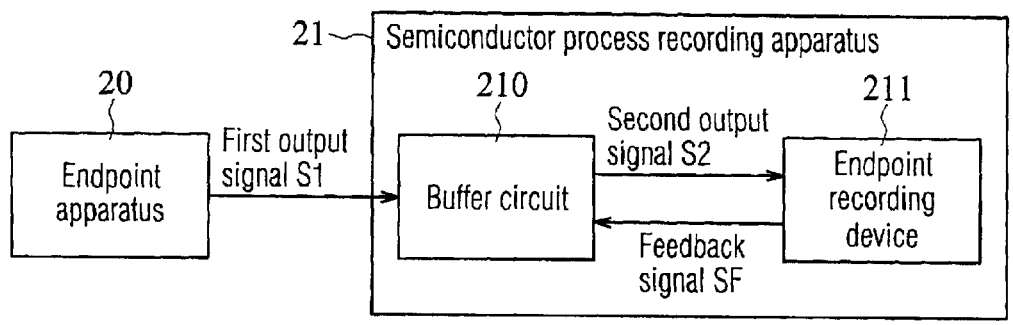
FIG. 2A is a circuit block diagram showing a semiconductor process recording apparatus of a first embodiment according to the present invention.

FIG. 2A is a circuit block diagram showing a semiconductor process recording apparatus of a first embodiment according to the present invention. As shown in FIG. 2A, a semiconductor process recording apparatus 21 of the first embodiment according to the present invention includes a buffer circuit 210 and a endpoint recoding device 211. The endpoint recording device 211 may be the conventional semiconductor process recording apparatus 11 or the like. The semiconductor process recording apparatus 21 is connected to an external endpoint apparatus 20, for recording the working state of the endpoint apparatus 20. For example, may be a decoupled plasma source apparatus or the like.

More specifically, the input terminal of the buffer circuit 210 in the semiconductor process recording apparatus 21 is connected to the endpoint apparatus 20, for receiving a first signal S1 output from the endpoint apparatus 20. For example, the first signal S1 may contain the data related to the working state of the endpoint apparatus 20. In response to the received first signal S1, the buffer circuit 210 outputs, through the output terminal thereof, a second signal S2 representative of the first signal S1. For example, the second signal S2 has the same voltage level as the first signal S1. The endpoint recording device 211 is connected to the output terminal of the buffer circuit 210, for receiving the second signal S2. Subsequently, the endpoint recording device 211 records the data related to the working state of the endpoint apparatus 20 on the basis of the second signal S2 and outputs a feedback signal SF to the buffer circuit 210. In the semiconductor process recording apparatus 21 according to the present invention, the buffer circuit 210 blocks the feedback signal SF output from the endpoint recording device 211, so the feedback signal SF is not output into the external endpoint apparatus 20. Therefore, the endpoint apparatus 20 is not damaged by the feedback signal SF even if the feedback signal SF has a high voltage level pulse or the endpoint apparatus 20 keeps outputting power for a long time. Therefore, it is not necessary for the process to be stopped for replacing new apparatus, thereby greatly reduce the production cost and rate of semiconductor manufacturing.

Figure 2B:
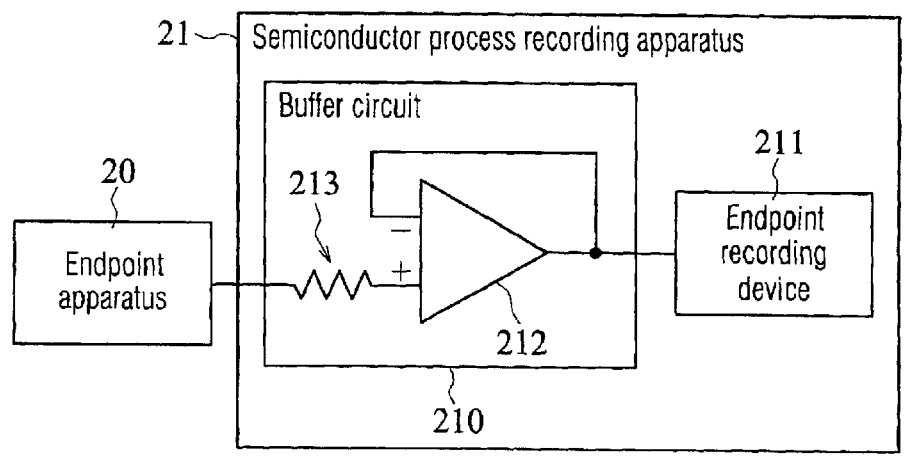
FIG. 2B is a detailed circuit diagram showing an example of the buffer circuit in a semiconductor process recording apparatus of a first embodiment according to the present invention.

FIG. 2B is a detailed circuit diagram showing an example of the buffer circuit in a semiconductor process recording apparatus of a first embodiment according to the present invention. As shown in FIG. 2B, the buffer circuit 210 includes a voltage follower 212 and a resistor 213. The signal output from the voltage follower 212 is the same in voltage level as the signal input to itself. Therefore, after receiving the first signal S1, the buffer circuit 210 outputs the second signal S2 having the same voltage level as the first signal S1. As for the resistor 213, it serves as a current limiting resistor for limiting the current of the first signal S1, thereby protecting the buffer circuit 210 as well as the semiconductor process recording apparatus 21.

Figure 3:
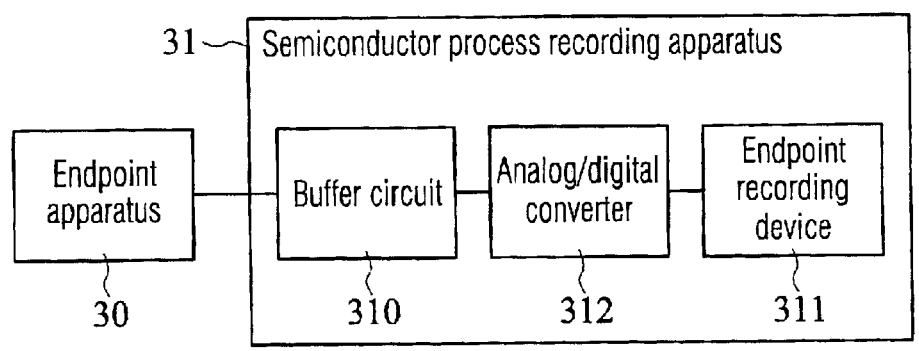
FIG. 3 is a circuit block diagram showing a semiconductor process recording apparatus of a second embodiment according to the present invention.

FIG. 3 is a circuit block diagram showing a semiconductor process recording apparatus of a second embodiment according to the present invention. Compared with the first embodiment shown in FIG. 2A, the semiconductor process recording apparatus 31 of the second embodiment according to the present invention further includes a analog/digital converter 312 connected between the buffer circuit 310 and the endpoint recording device 311. In other words, the buffer circuit 310 is connected to the endpoint recording device 311 through the analog/digital converter 312, as shown in FIG. 3. The analog/digital converter 312 converts an analog and a digital signal, as input signals, into a digital and an analog signal, as output signals, respectively. Therefore, an analog signal output from the endpoint apparatus 30 through the buffer circuit 310 is converted into a digital signal by the analog/digital converter 312 for inputting to the endpoint device 311.

Like the first embodiment, the buffer circuit 310 in the semiconductor process recording apparatus 31 of the second embodiment according to the present invention blocks the feedback signal usually having a high voltage level pulse output from the endpoint recording device 311. Therefore, the semiconductor process recording apparatus 31 of the second embodiment according to the present invention successfully prevents the external endpoint apparatus 30 from being burned out so it is not necessary for the process to be stopped for replacing new apparatus, thereby greatly reduce the production cost and rate of semiconductor manufacturing.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A semiconductor process recording apparatus, connected to an external endpoint apparatus, comprising:

a buffer circuit connected to said endpoint apparatus for receiving a first signal output from said endpoint apparatus and then outputting a second signal representing said first signal; and an endpoint recording device connected to said buffer circuit for receiving said second signal and outputting a feedback signal to said buffer circuit on the basis of said second signal, wherein said buffer circuit blocks said feedback signal so as to prevent said feedback signal from being directly input to said endpoint apparatus.

2. A semiconductor process recording apparatus according to claim 1, wherein:

said buffer circuit comprises a voltage follower having an input terminal connected to said endpoint apparatus for receiving said first signal and an output terminal connected to said endpoint recording device for outputting said second signal.

3. A semiconductor process recording apparatus according to claim 2, wherein:

said buffer circuit further comprises a resistor connected between said input terminal of said voltage follower and said endpoint apparatus for limiting the current of said first signal.

4. A semiconductor process recording apparatus according to claim 1, further comprising:

an analog/digital converter connected between said buffer circuit and said endpoint recording device for converting said second signal from analog to digital.

5. A semiconductor process recording apparatus according to claim 1, wherein:

said endpoint apparatus is a decoupled plasma source process apparatus.

6. A semiconductor process recording apparatus according to claim 1, wherein:

said feedback signal has a high voltage level pulse.

7. A semiconductor process recording apparatus according to claim 1, wherein:

said second signal has the same voltage level as said first signal.

* * * * *